United States Statutory Invention Registration [19]

[11] Reg. Number: H650

Lindenmeyer [43] Published: Jul. 4, 1989

[54] DOUBLE SIDED CIRCUIT BOARD AND A METHOD FOR ITS MANUFACTURE

[75] Inventor: Carl W. Lindenmeyer, St. Charles, Ill.

[73] Assignee: The United States of America as represented by the United States Department of Energy, Washington, D.C.

[21] Appl. No.: 182,671

[22] Filed: Apr. 14, 1988

[51] Int. Cl.[4] ..... H05K 1/02; H05K 3/02

[52] U.S. Cl. ..... 174/68.5; 29/846

[56] References Cited

U.S. PATENT DOCUMENTS

| | | |
|---|---|---|
| 4,351,697 | 9/1982 | Shanefield et al. . |
| 4,360,570 | 11/1982 | Andreades et al. . |
| 4,597,988 | 7/1986 | Kukanskis et al. . |
| 4,610,756 | 9/1986 | Strobel . |
| 4,689,111 | 8/1987 | Chan et al. . |

*Primary Examiner*—Stephen C. Buczinski
*Assistant Examiner*—Linda J. Wallace
*Attorney, Agent, or Firm*—John M. Albrecht; Judson R. Hightower

[57] ABSTRACT

Conductance between the sides of a large double sided printed circuit board is provided using a method which eliminates the need for chemical immersion or photographic exposure of the entire large board. A plurality of through-holes are drilled or punched in a substratum according to the desired pattern, conductive laminae are made to adhere to both sides of the substratum covering the holes and the laminae are pressed together and permanently joined within the holes, providing conductive paths.

10 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DOUBLE SIDED CIRCUIT BOARD AND A METHOD FOR ITS MANUFACTURE

CONTRACTUAL ORIGIN OF THE INVENTION

The United States Government has rights in this invention pursuant to Contract No. DE-AC02-76CH03000 between the U.S. Department of Energy and Universities Research Association, Inc.

BACKGROUND OF THE INVENTION

This invention relates to a double sided printed circuit board and to a method for making double sided printed circuit boards.

Printed circuit boards are commonplace in modern society. Resistors, capacitors, semiconductors and integrated circuits are joined together by conductive paths on an insulating surface. The board provides both the support for the circuit elements and the means for conductance between them. Where space is limited or the circuitry complex, both sides of a board might be used, or multiple boards might be joined together.

Manufacture of a printed circuit board generally begins with a substratum of insulating material such as bakelite, epoxy resin, glass fiber reinforced resins, or polyester. Using substractive technology well known in the prior art, a lamina of copper or other conductor is adhered to the substratum. Then, using a printing or photographic process, the desired circuit pattern is outlined on the lamina. Finally, unwanted material is removed by etching or routing, leaving the circuit in place.

The prior art also provides other methods for deposing a circuit on a printed circuit board, including electroplating and electroless or wet chemical plating, involving the use of catalysts. For large boards, such as those used in particle accelerator calorimeters, these chemical methods are less desirable because they require submersion, photographic exposure, or offset printing of the full face of the board, and therefore large equipment investments. For large boards, mechanical methods are preferred, such as using a router guided by a computer.

The choice of methods has not been so clear for the next step in the manufacture of very large printed circuit boards, namely provision for conductance between double sides. Typically conductance between the sides of a printed circuit board is provided by means of a metal lined through-hole or by a component such as a resistor or capacitor mounted within a metal lined through-hole. A metallic land surrounds the lined hole, providing a connection between the conductive path or component mounting pin and the metal lining.

Several methods for the metallization of the sides of the through-hole and the creation of the land are well known in the prior art. An eyelet or grommet can be inserted, and soldered in place. Or, the hole can be lined as part of the electroplating process; the inside of the hole is made electrically conductive with graphite or a thin metallic film before the board is immersed in the electroplating bath. Dry metallization techniques such as vacuum metallization have also been developed, including sputtering, ion plating and electron beam vacuum deposition. Examples of the prior art include disclosures contained in U.S. Pat. Nos. 4,610,756, 4,360,570, and 4,351,697.

One problem associated with these methods for metallizing a hole is that adhesion of the solder or metallic liner to the laminae is often less than adequate. Also, holes must be drilled precisely, free of burrs and errant fibers. Pre-treatment of the surface with suitable chemicals is often required to insure that liner coverage is adequate and uniform to provide a good electrically conductive surface. Clean-up is frequently necessary to remove superfluous material.

The above problems are accentuated when the printed circuit board is extraordinarily large or highly miniaturized, or when it is to be used in restrictive environments such as during extreme temperature changes or while carrying large currents. The costs of overcoming these problems can be high, including specialized handling and cleaning equipment, expensive materials and chemicals, and labor intensive pre-treatment and clean-up operations.

It is an object of this invention to provide a double-sided circuit board which maintains superior conductance between opposite sides of the board.

It is another object of this invention to provide a double-sided circuit board which substantially reduces or eliminates problems of adhesion within through-holes, and resultant costs for pre-treatment and clean-up.

It is another object of this invention to provide a double-sided circuit board which is resilient in extreme conditions, such as during extreme temperature changes and while carrying large currents.

It is a further object of this invention to provide a method for economically manufacturing a double-sided printed circuit board, using equipment which is readily available at low cost.

Additional objects, advantages and novel features of the invention will become apparent to those skilled in the art upon examination of the following and by practice of the invention.

SUMMARY OF THE INVENTION

To achieve the foregoing and other objects, this invention comprises a double-sided printed circuit board having a substratum, conductive laminae adhering to both sides of the substratum and a plurality of through-holes in which the conductive laminae have been pressed together and permanently joined, providing a conductive path from one side of the board to the other.

BRIEF DESCRIPTION OF THE DRAWINGS

The present invention is illustrated in the accompanying drawings depicting an improved double sided circuit printed board and the steps involved in manufacturing a double sided printed circuit board, where.

DETAILED DESCRIPTION OF THE INVENTION

Figure 1:
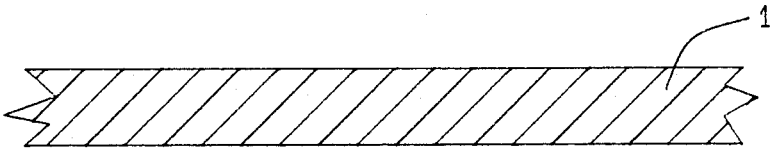
FIG. 1 illustrates an uncoated insulating substratum.

Referring to the drawings, FIG. 1 depicts the preferred embodiment of insulating substratum 1, which is monolayer and made of epoxy fiberglass. As alternatives, material of the substratum may be double layer or multilayer, and made of bakelite, epoxy resin, polyesters or other glass fiber reinforced resins.

Figure 2:
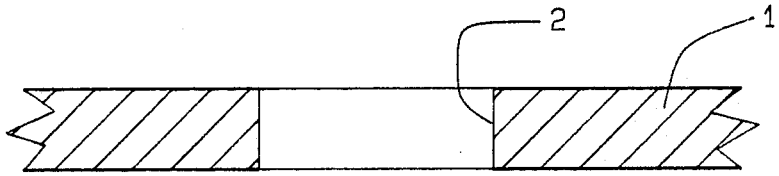
FIG. 2 depicts a substratum with a through-hole drilled or punched.

As exemplified in FIG. 2, a hole 2 is drilled or punched in the substratum 1 according to the desired pattern.

Figure 3:
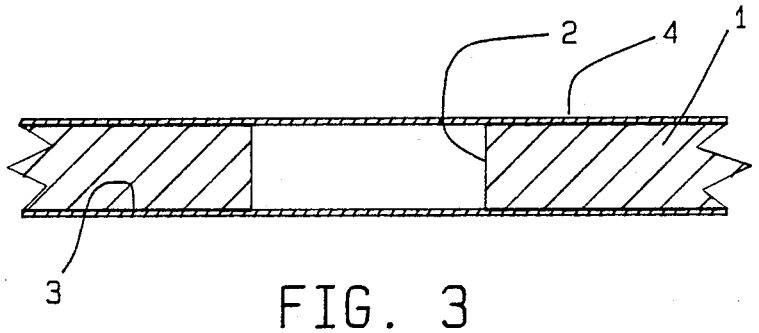
FIG. 3 shows the drilled substratum which was first coated with adhesive and then to which two laminae have been attached to the respective sides.

An acrylic adhesive 3 is roller coated on the substratum 1, as depicted in FIG. 3. Alternately, the adhesive may be hot melt epoxy or other adhesive, depending upon the desired peel strength, flexibility at low temperature or other conditions. Moderate peel strength is used here for large boards, so that large foil areas can be removed by mechanical means.

Figure 4:
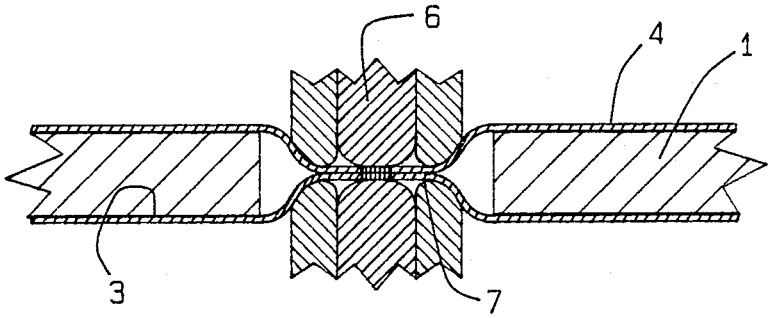
FIG. 4 illustrates a novel method for joining the laminae together, showing a spotwelder pressing and permanently joining the laminae within a through-hole.

As depicted in FIG. 3, laminae 4 of 1 mil. copper foil each are laid on the coated substratum 1 on the respective sides of the substratum, entirely covering the pattern holes 2. Conductance between the laminae 4 and thus between the surfaces of the double sided board is provided by joining the laminae 4 together as shown in FIG. 4. The foil laminae 4 are pressed together within the holes 2 and a juncture 7 is formed between the laminae 4, using an electric or ultrasonic spotwelder 6.

Figure 5:
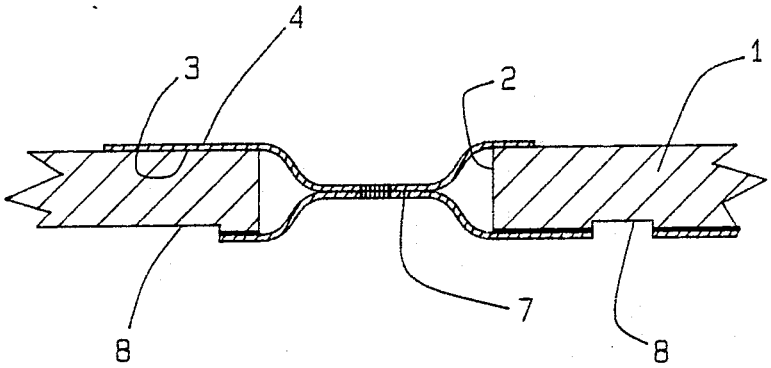
FIG. 5 depicts a laminate with the laminae having been etched or routed to form a circuit pattern.

Finally, the surfaces of the laminae 4 are routed such as at locations 8 as shown in cross section FIG. 5. The conductance of the laminae 4 is interrupted by the absence of conducting material or separations 8, thus forming circuit patterns on both sides of the board joined through the juncture 7.

Figure 6:
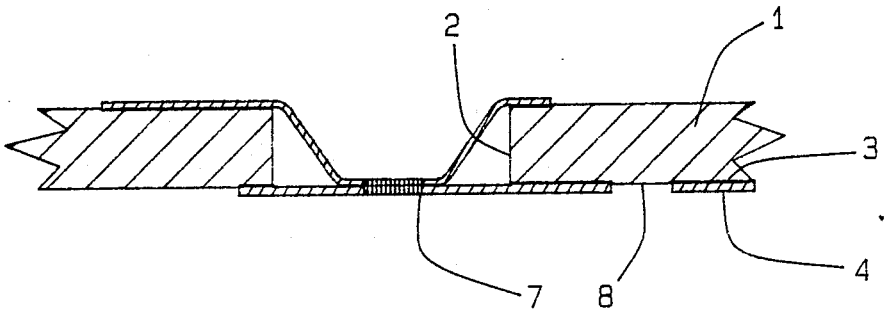
FIG. 6 depicts another embodiment of the invention illustrating an alternate method for joining laminae, resulting in only one lamina being deformed before spotwelding.

FIG. 6 depicts another embodiment of the invention. A juncture 7 is formed by deforming only one lamina 4 using an electric spotwelder. Both laminae 4 are routed providing separations 8 according to the desired pattern.

Using either method, as depicted in FIG. 5 or as depicted in FIG. 6, conductance between opposite sides of the board is superior. Neither the laminae 4 nor other elements of the circuit pattern are required to adhere to the walls of the through-hole 2, thus entirely eliminating problems of adhesion which are commonplace in the prior art. When exposed to extreme conditions such as extreme temperatures or large currents the material of the juncture 7 responds as part of the laminae 4, expanding and contracting, and in effect acting as a spring without points of concentrated stress.

No additional equipment is required to form the juncture 7 except the electric or ultrasonic spotwelder 6, which is readily available in varying designs at relatively low cost. Costs of handling and cleaning equipment are minimized compared to costs of equipment used for methods requiring full submersion or photographic exposure of a large circuit board.

The embodiment of the invention in which an exclusive property or privilege is claimed is defined as follows:

1. A double-sided circuit board which comprises:

a supporting substratum made of electrically insulating material;

adhesive applied to each surface of said substratum;

a desired and predetermined pattern comprised of holes drilled through said substratum;

a lamina on each surface of said substratum and adhering to said surface by said adhesive;

junctures between said laminae within said holes, comprising deformations of said laminae such that each said lamina abuts said lamina on the opposite side of said substratum and is permanently joined to said lamina;

said laminae and junctures comprising a circuit pattern according to a desired and predetermined design.

2. The circuit board as recited in claim 1 wherein said substratum is from the group of materials consisting of bakelite, epoxy resin, glass fiber reinforced resins and polyester.

3. The circuit board as recited in claim 2 wherein said substratum comprises two layers of material, adhering to one another as one by a layer of adhesive between said layers.

4. The circuit board as recited in claim 2 wherein said substratum comprises multiple layers of material, adhering to adjacent layers as one by layers of adhesive between said adjacent layers.

5. The circuit board as recited in claim 1 wherein said adhesive is acrylic.

6. The circuit board as recited in claim 1 wherein said adhesive is hot melt epoxy.

7. The circuit board as recited in claim 1 wherein said laminae are composed of copper.

8. The circuit board as recited in claim 1 wherein said junctures are comprised of equal deformations of both said laminae such that each said lamina abuts the opposite said lamina near the midpoint of each said hole.

9. The circuit board as recited in claim 1 wherein said junctures are comprised of deformation of only one said lamina such that said deformed lamina abuts the opposite said lamina in the plane of the opposite said lamina.

10. A method for manufacturing a double-sided circuit board comprising:

providing a supporting substratum made of electrically insulating material;

applying adhesive to both surfaces of said substratum and exposing it to air until it is dry to touch;

forming a plurality of holes through said substratum according to a predetermined pattern;

laminating both sides of said substratum by adhering laminae to both sides of said substratum with said adhesive, said laminae covering said surfaces and said holes;

forming junctures between said laminae within said holes by pressing said laminae together until they abut one another and then making permanent said junctures by spotwelding; and removing portions of laminae to form a circuit pattern in said junctures and remaining laminae on both sides of said substratum according to a desired and predetermined design.

* * * * *